United States Patent
Otsubo

(10) Patent No.: US 9,936,575 B2
(45) Date of Patent: Apr. 3, 2018

(54) RESIN MULTILAYER SUBSTRATE AND COMPONENT MODULE

(71) Applicant: Murata Manufacturing Co., Ltd., Nagaokakyo-shi, Kyoto-fu (JP)

(72) Inventor: Yoshihito Otsubo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/160,190

(22) Filed: May 20, 2016

(65) Prior Publication Data
US 2016/0270221 A1 Sep. 15, 2016

Related U.S. Application Data

(63) Continuation of application No. PCT/JP2015/051609, filed on Jan. 22, 2015.

(30) Foreign Application Priority Data

Feb. 7, 2014 (JP) .................. 2014-022525

(51) Int. Cl.
*H05K 1/00* (2006.01)
*H05K 1/02* (2006.01)
(Continued)

(52) U.S. Cl.
CPC .......... *H05K 1/0298* (2013.01); *H01L 24/23* (2013.01); *H05K 1/028* (2013.01); *H05K 1/0313* (2013.01);
(Continued)

(58) Field of Classification Search
CPC .......... H05K 1/09; H05K 1/028; H05K 1/114; H05K 1/115; H05K 1/116; H05K 1/0271;
(Continued)

(56) References Cited

U.S. PATENT DOCUMENTS

2002/0076948 A1* 6/2002 Farrell ............... B32B 3/08
438/800
2004/0045157 A1* 3/2004 Hishinuma ......... H01L 21/4853
29/827
(Continued)

FOREIGN PATENT DOCUMENTS

JP 60-123917 U 8/1985
JP 8-186357 A 7/1996
(Continued)

OTHER PUBLICATIONS

Official Communication issued in corresponding Japanese Patent Application No. 2015-560919, dated Jan. 31, 2017.
(Continued)

*Primary Examiner* — Timothy Thompson
*Assistant Examiner* — Guillermo Egoavil
(74) *Attorney, Agent, or Firm* — Keating & Bennett, LLP

(57) ABSTRACT

A resin multilayer substrate includes a first resin layer, a conductive pattern that covers a portion of the first resin layer, a conductive via connected to the conductive pattern, and a second resin layer that is overlaid on the first resin layer. The second resin layer includes an opening through which the conductive pattern is partially exposed. As seen in plan view, the opening includes an inner peripheral edge including a first portion that is spaced from the conductive via by a first distance, and a second portion that is spaced from the conductive via by a second distance. The conductive pattern has a length that starts from the inner peripheral edge of the opening to outside and extends under the second resin layer. The length of the conductive pattern at the second portion is greater than the length of the conductive pattern at the first portion.

20 Claims, 6 Drawing Sheets

(51) Int. Cl.
  *H01L 23/00* (2006.01)
  *H05K 1/11* (2006.01)
  *H05K 3/46* (2006.01)
  *H05K 1/03* (2006.01)
  *H05K 1/09* (2006.01)
  *H05K 3/34* (2006.01)

(52) U.S. Cl.
  CPC .............. *H05K 1/09* (2013.01); *H05K 1/115* (2013.01); *H05K 1/116* (2013.01); *H05K 3/4632* (2013.01); *H05K 1/0271* (2013.01); *H05K 3/3436* (2013.01); *H05K 2201/0129* (2013.01)

(58) Field of Classification Search
  CPC .. H05K 1/0298; H05K 1/0313; H05K 3/0082; H05K 3/3436; H05K 3/4007; H05K 3/4617; H05K 3/4632; H05K 2201/068; H05K 2201/096; H05K 2201/0129; H05K 2201/0394; H05K 2201/09063; H05K 2201/09781; H05K 2201/2009; H05K 2203/1178; H01L 21/4853; H01L 21/486; H01L 23/3128; H01L 23/49816; H01L 23/49822; H01L 23/49827; H01L 24/06; H01L 24/23; H01L 24/81; H01L 25/0652; H01L 25/0657; H01L 2224/16; H01L 2224/0401; H01L 2224/04042; H01L 2224/16225; H01L 2224/48091; H01L 2924/00014; H01L 2924/3011; H01L 2924/3025; H01L 2924/01019; H01L 2924/01078; H01L 2924/01079; H01L 2924/01327; H01L 2924/15311
  USPC .................. 174/250, 257, 258, 261, 264; 257/E23.067, E23.069; 361/313, 321.2, 361/766; 438/125
  See application file for complete search history.

(56) References Cited

U.S. PATENT DOCUMENTS

| | | | |
|---|---|---|---|
| 2005/0087364 | A1 | 4/2005 | Umemoto |
| 2006/0044735 | A1* | 3/2006 | Hayashi ............ H01L 23/49816 361/313 |
| 2007/0181994 | A1* | 8/2007 | Fukase .................. H05K 1/116 257/700 |
| 2012/0102732 | A1 | 5/2012 | Maeda |
| 2012/0319254 | A1 | 12/2012 | Kikuchi et al. |
| 2013/0098670 | A1* | 4/2013 | Inoue .................. H05K 3/4007 174/264 |
| 2013/0105204 | A1* | 5/2013 | Hwang ................ H05K 1/0346 174/255 |
| 2014/0363927 | A1* | 12/2014 | Hurwitz ............... H05K 1/0298 438/125 |
| 2015/0034369 | A1* | 2/2015 | Kashima .................. C08L 63/00 174/255 |
| 2015/0053460 | A1* | 2/2015 | Kunimoto ............ H05K 3/4602 174/251 |
| 2015/0357277 | A1* | 12/2015 | Nagai ............... H01L 23/49838 174/255 |
| 2017/0117252 | A1* | 4/2017 | Baik .................. H01L 25/0652 |

FOREIGN PATENT DOCUMENTS

| | | |
|---|---|---|
| JP | 2005-129663 A | 5/2005 |
| JP | 2009-141133 A | 6/2009 |
| JP | 2010-135347 A | 6/2010 |
| JP | 2012-094682 A | 5/2012 |
| WO | 2011/108308 A1 | 9/2011 |
| WO | 2012/124421 A1 | 9/2012 |

OTHER PUBLICATIONS

Official Communication issued in International Application PCT/JP2015/051609, dated Mar. 10, 2015.

\* cited by examiner

RESIN MULTILAYER SUBSTRATE AND COMPONENT MODULE

BACKGROUND OF THE INVENTION

1. Field of the Invention

The present invention relates to a resin multilayer substrate and a component module.

2. Description of the Related Art

A resin multilayer substrate is fabricated by stacking a single-sided copper clad sheet, a double-sided copper clad sheet, and the like.

WO2011/108308 discloses an example of a multilayer substrate incorporating components. WO2012/124421 discloses an example of a multilayer substrate having a surface on which components are mounted.

For producing a single-sided copper clad sheet or a double-sided copper clad sheet, a copper foil and a resin sheet are not bonded by chemical bonding such as an adhesive. Accordingly, the joining strength between the copper foil and the resin sheet is relatively weak. Therefore, there have been cases where the copper foil peeled off from the resin sheet by a certain trigger after completion of an assembly as a thermoplastic resin multilayer substrate. Accordingly, a problem can occur in the junction performance between the resin multilayer substrate and a mother substrate, and between the resin multilayer substrate and incorporated components or mounted components, and a problem could occur also in the reliability. Particularly, a copper foil arranged on the main surface of the resin multilayer substrate is exposed to the outside, which poses a problem that such a copper foil is relatively more likely to peel off.

In general, it is an anchor effect that mainly supports a junction between a copper foil and a resin sheet. For example, in the case where the surface of the copper foil is microscopically coarse to some extent at the junction surface, the anchor effect is achieved. However, for improving the electrical characteristics, the surface roughness of the copper foil will tend to decrease, so that it becomes difficult to achieve the anchor effect. Accordingly, it becomes necessary to improve the adhesion strength by a method other than that for increasing the joining strength by the anchor effect.

The "copper foil" used herein is not limited to a copper foil, but can be a metal foil in general.

SUMMARY OF THE INVENTION

Thus, preferred embodiments of the present invention provide a resin multilayer substrate and a component module, by which adhesion strength between a conductive pattern and a resin layer is enhanced by an effect other than the anchor effect.

A resin multilayer substrate according to a preferred embodiment of the present invention includes a first resin layer including a main surface on a first side; a conductive pattern that covers a portion of the main surface of the first resin layer; a conductive via that extends through the first resin layer so as to be connected to the conductive pattern; and a second resin layer that is overlaid on the first side of the first resin layer. The second resin layer includes an opening through which the conductive pattern is partially exposed so as to include a projected area of the conductive via onto the conductive pattern. As seen in plan view, the opening includes an inner peripheral edge including a first portion that is spaced from the conductive via by a first distance; and a second portion that is spaced from the conductive via by a second distance longer than the first distance. The conductive pattern has a length that starts from the inner peripheral edge of the opening to outside and extends under the second resin layer. The length of the conductive pattern at the second portion is greater than the length of the conductive pattern at the first portion.

According to various preferred embodiments of the present invention, the adhesion strength between a conductive pattern and a resin layer is enhanced by an effect other than the anchor effect. Also, since the conductive pattern does not have to be excessively increased in size, the design flexibility such as a conductive pattern arrangement is able to be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
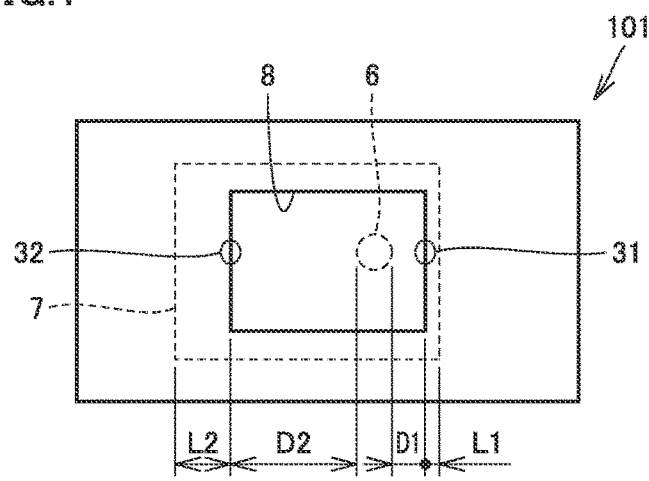
FIG. 1 is a plan view of a resin multilayer substrate according to a first preferred embodiment of the present invention.
Figure 2:
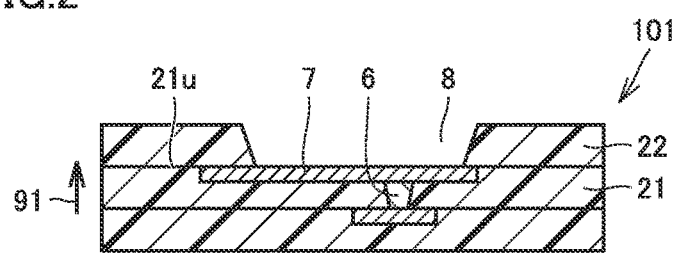
FIG. 2 is a cross-sectional view of the resin multilayer substrate according to the first preferred embodiment of the present invention.

Referring to FIGS. 1 and 2, a resin multilayer substrate according to a first preferred embodiment of the present invention will be hereinafter described. FIG. 1 shows a plan view of a resin multilayer substrate 101 in the present preferred embodiment, and FIG. 2 shows a cross-sectional view thereof.

Resin multilayer substrate 101 according to the present preferred embodiment includes a first resin layer 21 including a main surface 21u on a first side 91; a conductive pattern 7 defined by a metal foil and that covers a portion of main surface 21u of first resin layer 21; a conductive via 6 that passes through first resin layer 21 so as to be connected to conductive pattern 7; and a second resin layer 22 that is overlaid on first side 91 of first resin layer 21. Second resin layer 22 is provided with an opening 8 through which conductive pattern 7 is partially exposed so as to include a projected area of conductive via 6 onto conductive pattern 7. As seen in plan view, the internal peripheral edge of opening 8 includes: a first portion 31 that is spaced from conductive via 6 by a first distance D1; and a second portion 32 that is spaced from conductive via 6 by a second distance D2 longer than first distance D1. At first portion 31, conductive pattern 7 has a length L1 that starts from the inner peripheral edge of opening 8 to the outside and extends under second resin layer 22. At second portion 32, conductive pattern 7 has a length L2 that starts from the inner peripheral edge of opening 8 to the outside and extends under second resin layer 22. In this case, length L2 is greater than length L1.

The resin multilayer substrate 101 can be obtained, for example, according to a method described below.

(1) Prepare a resin layer (sheet) made of a thermoplastic resin including one surface or both surfaces onto which a metal foil such as a copper foil is applied, or a resin layer (sheet) made of a thermoplastic resin onto which a metal foil is not applied. In this case, a plurality of resin layers (sheets) are prepared. Alternatively, the contents equivalent to a plurality of resin layers may be processed into one large-sized sheet, which is then divided so that a plurality of resin layers may be obtained.

(2) By laser beam machining or the like, provide a hole not passing through a metal foil but passing through a resin layer so as to be located at a prescribed position in a specified resin layer among the plurality of resin layers.

(3) Fill the hole passing through the resin layer with a via material made of conductive paste and dry the resultant product.

(4) Subject a metal foil of the specified resin layer of the plurality of resin layers to etching or the like, thus forming a prescribed conductive pattern.

(5) Stack the plurality of resin layers, and thermo-compression bonding the stacked resin layers at a temperature equal to or higher than the softening temperature of the thermoplastic resin (for example, about 300° C.) so as to produce a stacked body, and also harden a via material filling the through hole to obtain a conductive via 6.

To form opening 8 in the stacked body defining resin multilayer substrate 101, the opening 8 may be provided by stacking a second resin layer having an opening provided in advance by means of punching, laser beam machining or the like, or by partially removing the resin layer by means of laser beam machining or the like after formation of the stacked body.

In the present preferred embodiment, an area in the vicinity of the outer edge of conductive pattern 7 is covered by second resin layer 22. Accordingly, conductive pattern 7 is pressed by second resin layer 22, so that this conductive pattern 7 is less likely to peel off. If peeling occurs, it goes without saying that conductive pattern 7 typically peels off from its outer edge as a starting point. Therefore, second resin layer 22 presses the area in the vicinity of the outer edge of conductive pattern 7 so as to cover the area, with the result that peeling of the conductive pattern is effectively suppressed. In other words, the adhesion strength between conductive pattern 7 and the resin layer is enhanced by an effect other than the anchor effect. Particularly at second portion 32 of the inner peripheral edge of opening 8 that is relatively farther away from conductive via 6, second resin layer 22 covers a relatively large area in the vicinity of the outer edge of conductive pattern 7.

In this case, the following is applied. In a region in which conductive via 6 is provided, conductive pattern 7 and conductive via 6 are electrically and mechanically joined to each other. The adhesion strength at this junction is greater than the adhesion strength at the junction obtained by the anchor effect between conductive pattern 7 and first resin layer 21 that defines and functions as a resin layer. Therefore, conductive pattern 7 is less likely to peel off from the resin layer in the vicinity of the region provided with conductive via 6 as compared with other regions. Specifically, conductive pattern 7 is relatively less likely to peel off at first portion 31 of the inner peripheral edge of opening 8 that is located on the side closer to conductive via 6 than at second portion 32 of the inner peripheral edge of opening 8 that is located on the side farther away from conductive via 6. Therefore, conductive pattern 7 is relatively more likely to peel off at second portion 32 that is located on the side farther away from conductive via 6. According to the present preferred embodiment, at second portion 32 of the inner peripheral edge of opening 8 that is located on the side farther away from conductive via 6, second resin layer 22 is to cover a relatively large area in the vicinity of the outer edge of conductive pattern 7. Accordingly, the adhesion strength at a portion that has been conventionally more likely to peel off is effectively compensated for, so that peeling of the conductive pattern is effectively suppressed or prevented.

On the other hand, at first portion 31 of the inner peripheral edge of opening 8 on the side located closer to conductive via 6, second resin layer 22 covers a relatively small area in the vicinity of the outer edge of conductive pattern 7 as compared with second portion 32. Thus, conductive pattern 7 is efficiently arranged while effectively suppressing or preventing peeling of conductive pattern 7. Therefore, the design flexibility of the conductive pattern in resin multilayer substrate 101 is improved.

In the present preferred embodiment, the joining strength is able to be ensured even if the size of conductive pattern 7 serving as a land electrode is relatively small.

Furthermore, the present preferred embodiment provides a structure in which conductive pattern 7 is exposed through opening 8 provided in second resin layer 22 as an uppermost layer. Accordingly, it becomes possible to suppress or prevent a short circuit caused when solder used for electrical connection to conductive pattern 7 overflows into an undesirable portion.

In the present preferred embodiment, the conductive pattern 7 and the upper surface of second resin layer 22 define and function as an uppermost surface, so that the coplanarity of resin multilayer substrate 101 is improved as a whole.

In this case, opening 8 preferably has a rectangular or substantially rectangular shape and has four sides. Thus, a portion of one side of this rectangle that is closest to conductive via 6 is selected as first portion 31 while a portion of another side of this rectangle that is closest to conductive via 6 is selected as second portion 32. In the present preferred embodiment, the side including first portion 31 and the side including second portion 32 are two sides opposite to each other, but first portion 31 and second portion 32 are not necessarily selected from such two sides opposite to each other. The shape of opening 8 is not limited to a rectangle but may be another shape. Although first portion 31 and second portion 32 each are located in the middle of a linear-shaped side in the present preferred embodiment, the side does not have to be a linear-shaped line, but may be a curved line.

Second Preferred Embodiment

Figure 3:
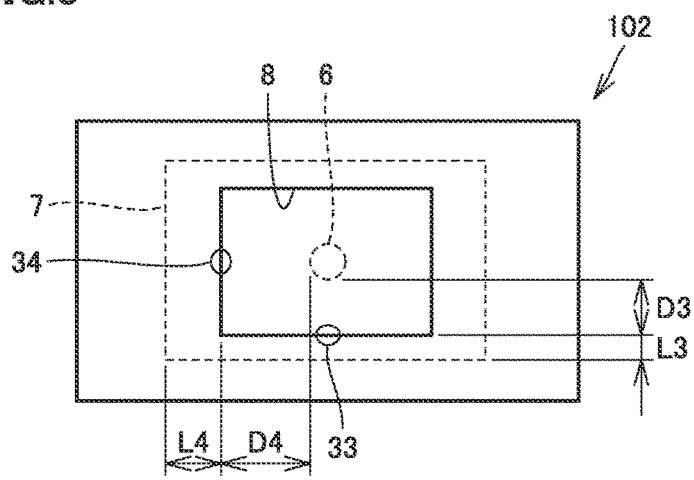
FIG. 3 is a plan view of a resin multilayer substrate according to a second preferred embodiment of the present invention.
Figure 4:
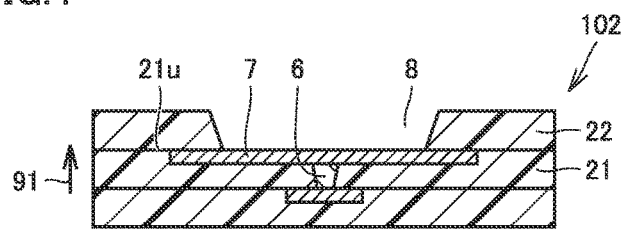
FIG. 4 is a cross-sectional view of the resin multilayer substrate according to the second preferred embodiment of the present invention.

Referring to FIGS. 3 and 4, a resin multilayer substrate according to a second preferred embodiment of the present invention will be hereinafter described. FIG. 3 shows a plan view of a resin multilayer substrate 102 in the present preferred embodiment, and FIG. 4 shows a cross-sectional view thereof.

In the first preferred embodiment, conductive via 6 is located not in the center of opening 8 but at a position spaced from the center, as seen in plan view. On the other hand, in resin multilayer substrate 102 according to the present preferred embodiment, conductive via 6 is located in the center of opening 8 as seen in plan view. Also in this case, the same applies as in the first preferred embodiment.

Resin multilayer substrate 102 in the present preferred embodiment includes a first resin layer 21 including a main surface 21u on a first side 91; a conductive pattern 7 defined by a metal foil and that covers a portion of main surface 21u of first resin layer 21; a conductive via 6 that extends through first resin layer 21 so as to be connected to conductive pattern 7; and a second resin layer 22 that is overlaid on first side 91 of first resin layer 21. Second resin layer 22 includes an opening 8 through which conductive pattern 7 is partially exposed so as to include a projected area of conductive via 6 onto conductive pattern 7. As seen in plan view, the inner peripheral edge of opening 8 includes a first portion 33 that is spaced from conductive via 6 by a first distance D3, and a second portion 34 that is spaced from conductive via 6 by a second distance D4 longer than first distance D3. At first portion 33, conductive pattern 7 has a length L3 that starts from the inner peripheral edge of opening 8 to the outside and extends under second resin layer 22. At second portion 34, conductive pattern 7 has a length L4 that starts from the inner peripheral edge of opening 8 to the outside and extends under second resin layer 22. In this case, length L4 is greater than length L3.

In this case, opening 8 preferably has a rectangular or substantially rectangular shape, in which a side including first portion 33 and a side including second portion 34 correspond to adjacent two sides arranged at a right angle.

The present preferred embodiment also achieves the same effects as those in the first preferred embodiment.

Third Preferred Embodiment

Figure 5:
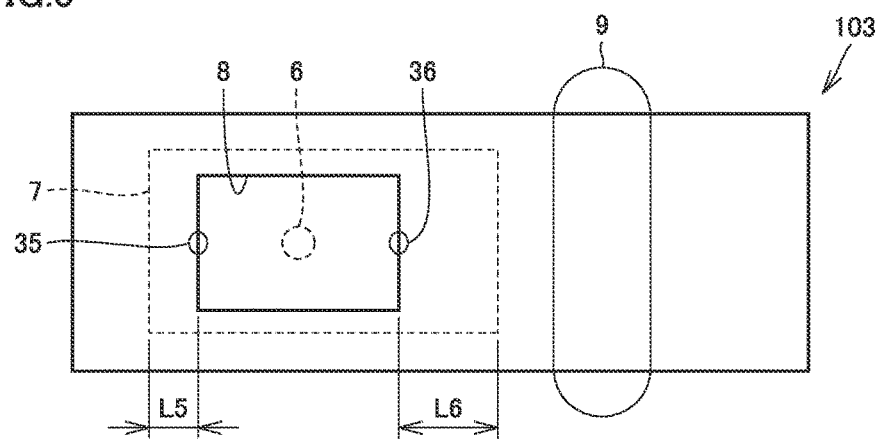
FIG. 5 is a plan view of a resin multilayer substrate according to a third preferred embodiment of the present invention.
Figure 6:
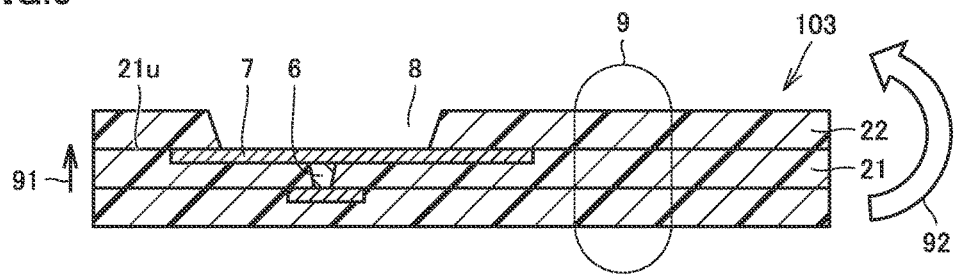
FIG. 6 is a cross-sectional view of the resin multilayer substrate according to the third preferred embodiment of the present invention.
Figure 7:
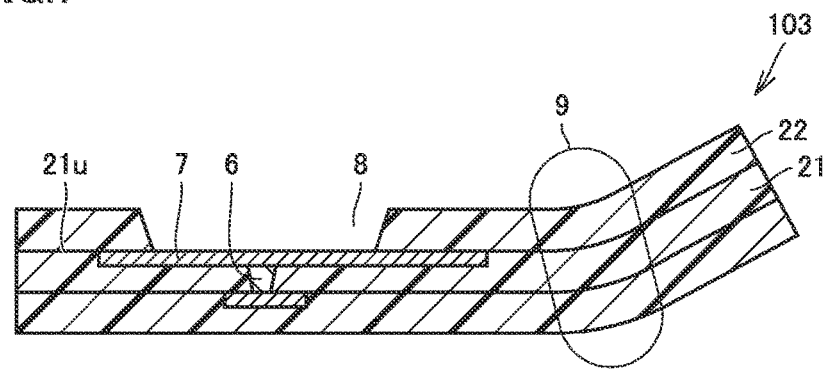
FIG. 7 is an explanatory diagram showing the state where the resin multilayer substrate according to the third preferred embodiment of the present invention is bent.

Referring to FIGS. 5 to 7, a resin multilayer substrate according to a third preferred embodiment of the present invention will be hereinafter described. FIG. 5 shows a plan view of a resin multilayer substrate 103 in the present preferred embodiment, and FIG. 6 shows a cross-sectional view thereof.

Resin multilayer substrate 103 includes a configuration similar to the first or second preferred embodiment. However, resin multilayer substrate 103 has a configuration different from the configuration as having been described in the first or second preferred embodiment in the following points. Resin multilayer substrate 103 includes a bending portion 9 provided so as to be adjacent to opening 8 as seen in plan view. As seen in plan view, the inner peripheral edge of opening 8 includes a non-bending portion-side portion 35 located on the side where bending portion 9 is not located; and a bending portion-side portion 36 located on the side where bending portion 9 is located. At non-bending portion-side portion 35, conductive pattern 7 has a length L5 that starts from the inner peripheral edge of opening 8 to the outside and extends under second resin layer 22. At bending portion-side portion 36, conductive pattern 7 has a length L6 that starts from the inner peripheral edge of opening 8 to the outside and extends under second resin layer 22. In this case, length L6 is greater than length L5.

During assembly or use, resin multilayer substrate 103 is repeatedly or continuously bent as shown by an arrow 92. Due to the action of this bending moment, resin multilayer substrate 103 is bent at bending portion 9 and turned into a state as shown in FIG. 7. In the case where such bending portion 9 is provided, conductive pattern 7 is more likely to peel off, than before bending, from the resin layer by the bending moment occurring during bending.

According to the present preferred embodiment, at bending portion-side portion 36, second resin layer 22 covers a relatively large area in the vicinity of the outer edge of conductive pattern 7. Accordingly, the adhesion strength between conductive pattern 7 and the resin layer is enhanced by an effect other than the mere anchor effect. Therefore, peeling of conductive pattern 7 is effectively suppressed or prevented even when bending is applied. In contrast, at non-bending portion-side portion 35 on the inner peripheral edge of opening 8, second resin layer 22 covers a relatively small area in the vicinity of the outer edge of conductive pattern 7. Accordingly, conductive pattern 7 is efficiently arranged.

Fourth Preferred Embodiment

Figure 8:
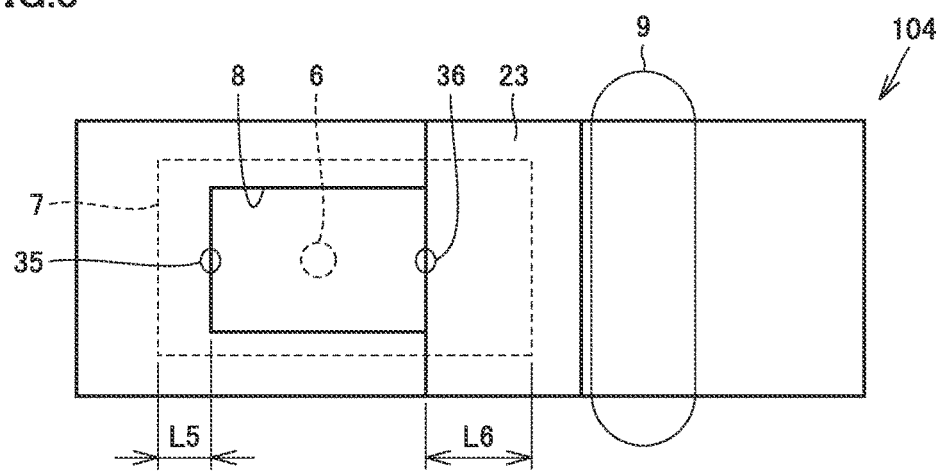
FIG. 8 is a plan view of a resin multilayer substrate according to a fourth preferred embodiment of the present invention.
Figure 9:
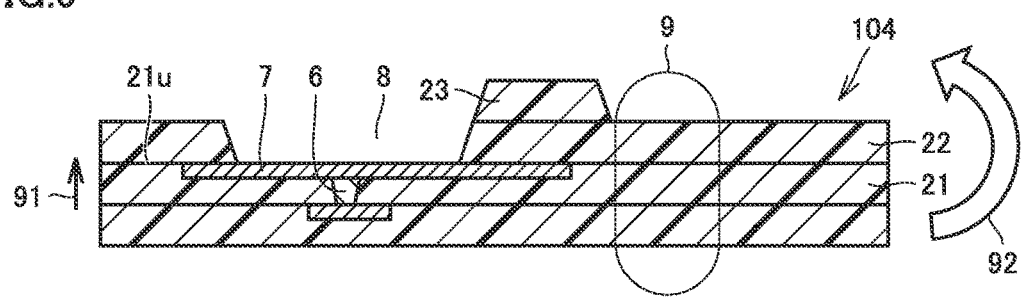
FIG. 9 is a cross-sectional view of the resin multilayer substrate according to the fourth preferred embodiment of the present invention.
Figure 10:
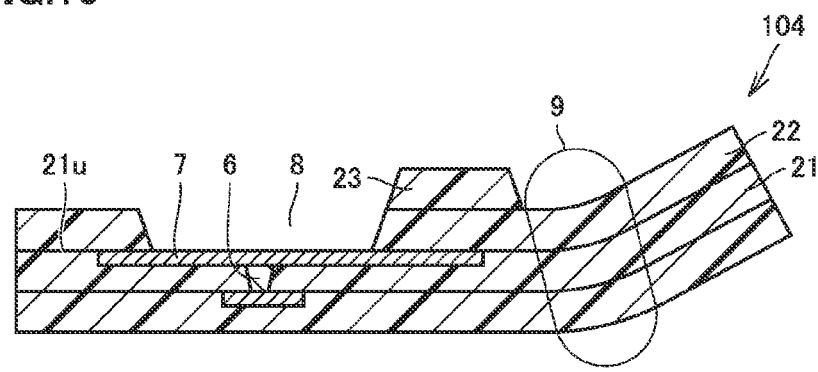
FIG. 10 is an explanatory diagram showing the state where the resin multilayer substrate according to the fourth preferred embodiment of the present invention.

Referring to FIGS. 8 to 10, a resin multilayer substrate according to a fourth preferred embodiment of the present invention will be hereinafter described. FIG. 8 shows a plan view of a resin multilayer substrate 104 in the present preferred embodiment, and FIG. 9 shows a cross-sectional view thereof.

Resin multilayer substrate 104 basically includes a configuration as having been described in the third preferred embodiment. However, resin multilayer substrate 104 has a configuration different from the configuration as having been described in the third preferred embodiment in the following points. Resin multilayer substrate 104 includes a bending portion-side portion 36, in which a third resin layer 23 is overlaid on first side 91 of second resin layer 22 so as to at least partially cover a region in which conductive pattern 7 extends under second resin layer 22.

During assembly or use, resin multilayer substrate 104 is repeatedly or continuously bent as shown by an arrow 92. Due to the action of this bending moment, resin multilayer substrate 104 is bent at bending portion 9 and turned into a state shown in FIG. 10.

The present preferred embodiment also achieves the same effects as those in the third preferred embodiment. Furthermore, in the present preferred embodiment, third resin layer 23 is overlaid at bending portion-side portion 36 as described above. Accordingly, peeling between second resin layer and conductive pattern 7 occurring at bending portion-side portion 36 is suppressed or prevented, so that the adhesion strength between the conductive pattern and the resin layer is enhanced.

Fifth Preferred Embodiment

Figure 11:
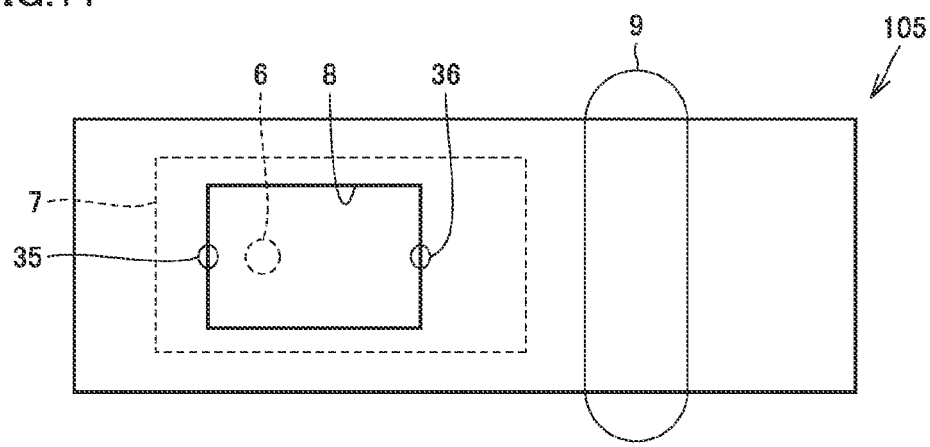
FIG. 11 is a plan view of a resin multilayer substrate according to a fifth preferred embodiment of the present invention.
Figure 12:
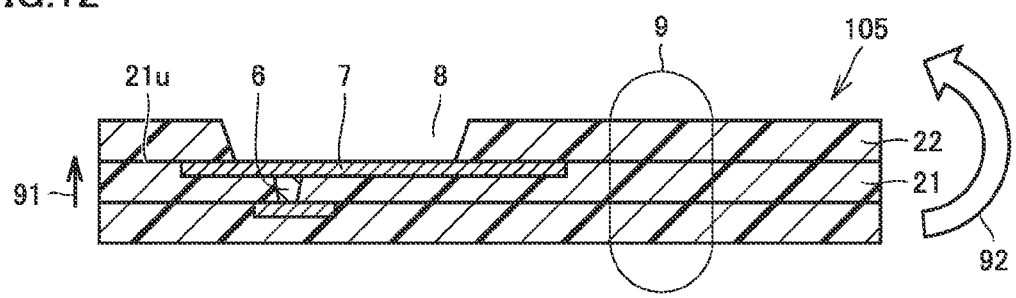
FIG. 12 is a cross-sectional view of the resin multilayer substrate according to the fifth preferred embodiment of the present invention.
Figure 13:
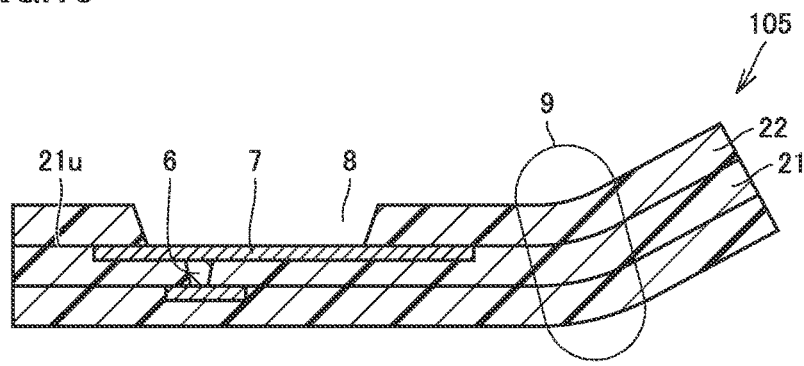
FIG. 13 is an explanatory diagram showing the state where the resin multilayer substrate according to the fifth preferred embodiment of the present invention is bent.

Referring to FIGS. 11 to 13, a resin multilayer substrate according to a fifth preferred embodiment of the present invention will be hereinafter described. FIG. 11 shows a plan view of a resin multilayer substrate 105 in the present preferred embodiment, and FIG. 12 shows a cross-sectional view thereof.

Resin multilayer substrate 105 basically includes a configuration as having been described in the third preferred embodiment. In resin multilayer substrate 103 shown in FIGS. 5 to 7 according to the third preferred embodiment, conductive via 6 is located in the center of opening 8 as seen in plan view. On the other hand, in resin multilayer substrate 105 according to the present preferred embodiment, conductive via 6 is located not in the center of opening 8 but at a position in the inner region of opening 8 that is farther away from bending portion 9. In other words, conductive via 6 is located at a position closer to non-bending portion-side portion 35.

During assembly or use, resin multilayer substrate 105 is repeatedly or continuously bent as shown by an arrow 92. Due to the action of this bending moment, resin multilayer substrate 105 is bent at bending portion 9 and turned into a state shown in FIG. 13.

The present preferred embodiment also achieves the same effects as those in the third preferred embodiment.

Sixth Preferred Embodiment

Figure 14:
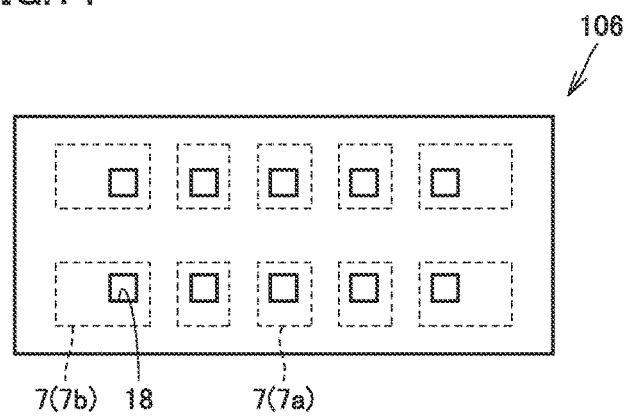
FIG. 14 is a plan view of a resin multilayer substrate according to a sixth preferred embodiment of the present invention.
Figure 15:
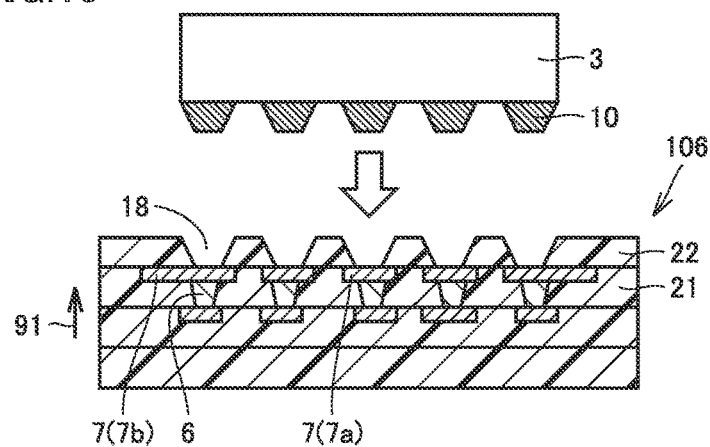
FIG. 15 is an explanatory diagram showing the manner in which a component is mounted on the resin multilayer substrate according to the sixth preferred embodiment of the present invention.
Figure 16:
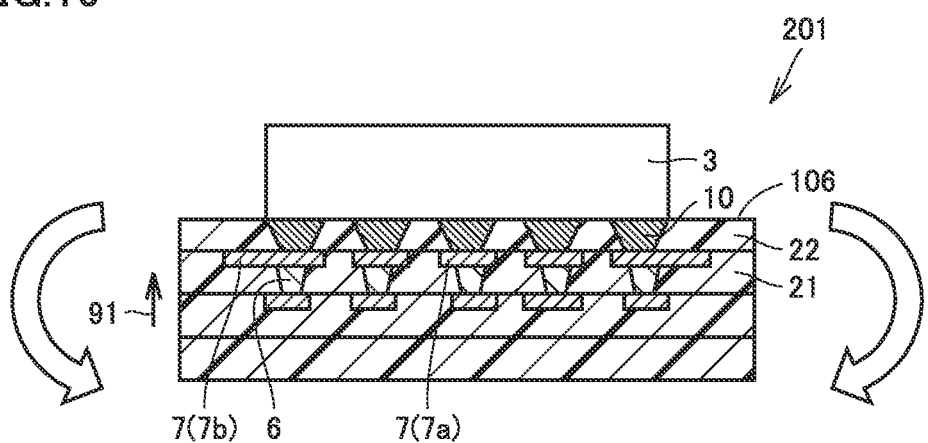
FIG. 16 is a cross-sectional view showing the state after the component has been mounted on the resin multilayer substrate according to the sixth preferred embodiment of the present invention, and also shows a cross-sectional view of a component module according to a seventh preferred embodiment of the present invention.

Referring to FIGS. 14 to 16, a resin multilayer substrate according to a sixth preferred embodiment of the present invention will be hereinafter described. FIG. 14 shows a plan view of a resin multilayer substrate 106 in the present preferred embodiment. FIG. 15 shows the state immediately before component 3 is mounted on resin multilayer substrate 106. Resin multilayer substrate 106 is shown in sectional view in FIG. 15.

Resin multilayer substrate 106 includes a first resin layer 21 including a main surface 21*u* on a first side 91; a plurality of conductive patterns 7 each defined by a metal foil and located on main surface 21*u* of first resin layer 21 so as to be joined to a product located on first side 91 of first resin layer 21; a conductive via 6 that extends through first resin layer 21 so as to be connected to a corresponding one of the plurality of conductive patterns 7; and a second resin layer 22 that is overlaid on first side 91 of first resin layer 21. Second resin layer 22 includes a plurality of openings 18 through which the plurality of conductive patterns 7 are partially exposed. Although not specifically shown, conductive via 6 and conductive pattern 7 located in a region inside each of the plurality of openings 18 establish the relation as having been described in the first or second preferred embodiment, that is, the following relationship is established. Specifically, as seen in plan view, the inner peripheral edge of opening 18 includes a first portion that is spaced from conductive via 6 by a first distance; and a second portion that is spaced from conductive via 6 by a second distance longer than the first distance. Conductive pattern 7 has a length that starts from the inner peripheral edge of opening 18 to the outside and extends under second resin layer 22. The length of conductive pattern 7 at the second portion is greater than the length of conductive pattern 7 at the first portion. Furthermore, as seen in plan view, the plurality of conductive patterns 7 include a first conductive pattern 7*a* located in the center portion of component 3 and having a length that starts from the inner peripheral edge of opening 18 to the outside and extends under second resin layer 22; and a second conductive pattern 7*b* located at the end of component 3 and having a length that starts from the inner peripheral edge of opening 18 to the outside and extends under second resin layer 22, in which case the maximum value of the length of conductive pattern 7*b* is greater than the maximum value of the length of conductive pattern 7*a*. In addition, the "first conductive pattern 7*a* located in the center portion of component 3" used herein means a conductive pattern 7 that is located closest to the center of gravity of component 3 when component 3 is seen in plan view.

Component 3 is mounted as a product on the upper surface of resin multilayer substrate 106 as described above. A bump 10 is provided on the lower surface of component 3. Bump 10 may be a solder bump, for example. Bump 10 may be fluid during the mounting operation. The number and arrangement of bumps 10 shown in the figure are merely by way of example and not limited thereto. Also, other bonding materials such as an electrically conductive adhesive may be used in place of bumps.

FIG. 16 shows a cross-sectional view in the state where component 3 has been mounted on resin multilayer substrate 106. Bumps 10 extend into a plurality of openings 18, respectively, and are electrically connected to a plurality of conductive patterns 7, respectively.

In the present preferred embodiment, the plurality of conductive patterns 7 each define and function as a land electrode. In the present preferred embodiment, the joining strength is able to be ensured even if the size of each land electrode is relatively small. Particularly even in the case where the plurality of conductive patterns 7 each defining and functioning as a land electrode are densely mounted as in the present preferred embodiment, conductive patterns 7 are able to be efficiently arranged while suppressing or preventing peeling of conductive patterns 7. In the present preferred embodiment, the joining strength is ensured. Accordingly, even when bending is applied as shown by an arrow in FIG. 16 in the state after component 3 has been mounted, peeling between the conductive pattern and the resin layer is less likely to occur.

The present preferred embodiment provides a structure in which land electrodes are exposed through a plurality of openings 18 provided in second resin layer 22 as an uppermost layer, which leads to a configuration in which second resin layer 22 as an uppermost layer that separates the land electrodes from each other. Therefore, even in the case where a gap between the land electrodes is relatively narrow, mounting failures such as a solder short are less likely to occur.

Second resin layer 22 is located on the uppermost layer, so that the coplanarity of resin multilayer substrate 106 is improved as a whole.

Although an explanation has been given in the present preferred embodiment with regard to an example in which a product is provided as component 3 and resin multilayer substrate 106 and component 3 are joined to each other, other various components are conceivable as a product to be joined. For example, the product may be a mother board. Preferred embodiments of the present invention are also applicable to a configuration in which resin multilayer substrate 106 and a mother board (not shown) such as a printed wiring board are connected to each other by a bump, an electrically conductive adhesive, and the like.

Seventh Preferred Embodiment

Referring to FIG. 16, a component module according to a seventh preferred embodiment of the present invention will be hereinafter described. FIG. 16 shows a component module 201 according to a preferred embodiment of the present invention. This component module 201 includes a resin multilayer substrate 106 having been described in the sixth preferred embodiment; and a component 3 as a product joined to resin multilayer substrate 106 utilizing a plurality of conductive patterns 7. The shape of component 3 shown in FIG. 16 is merely by way of example and not limited thereto. The product may be those other than component 3.

According to the component module in the present preferred embodiment, the adhesion strength between the conductive pattern and the resin layer is improved.

Although the sixth and seventh preferred embodiments each show an example in which only a single component 3 is mounted, a plurality of components may be mounted.

The above-described preferred embodiments disclosed herein are illustrative and non-restrictive in every respect. The scope of the present invention is defined by the terms of the claims, rather than the description above, and is intended to include any modifications within the meaning and scope equivalent to the terms of the claims.

Various preferred embodiments of the present invention can be utilized for a resin multilayer substrate and a component module.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
a first resin layer including a main surface on a first side and made of a thermoplastic resin;
a conductive pattern defined by a metal foil and that covers a portion of the main surface of the first resin layer;
a conductive via that extends through the first resin layer so as to be connected to the conductive pattern; and
a second resin layer that is overlaid on the first side of the first resin layer and made of a thermoplastic resin; wherein the first resin layer and the second resin layer are thermocompression bonded to each other;
the second resin layer including an opening through which the conductive pattern is partially exposed so as to include a projected area of the conductive via that is projected onto the conductive pattern;
as seen in plan view, the opening includes an inner peripheral edge including a first portion that is spaced from the conductive via by a first distance, and a second portion that is spaced from the conductive via by a second distance longer than the first distance;
the conductive pattern has a length that starts from the inner peripheral edge of the opening to outside and extends under the second resin layer; and
the length of the conductive pattern at the second portion is greater than the length of the conductive pattern at the first portion.

2. The resin multilayer substrate according to claim 1, further comprising a bending portion located adjacent to the opening as seen in plan view; wherein
as seen in plan view, the inner peripheral edge of the opening includes a non-bending portion-side portion located on a side where the bending portion is not located, and a bending portion-side portion located on a side where the bending portion is located; and
the length of the conductive pattern at the bending portion-side part is greater than the length of the conductive pattern at the non-bending portion-side part.

3. The resin multilayer substrate according to claim 2, wherein at the bending portion-side portion, a third resin layer is overlaid on the first side of the second resin layer so as to at least partially cover a region in which the conductive pattern extends under the second resin layer.

4. The resin multilayer substrate according to claim 1, wherein the conductive pattern and the conductive via are electrically and mechanically joined to each other.

5. The resin multilayer substrate according to claim 1, wherein an adhesion strength between the conductive pattern and the conductive via is greater than an adhesion strength between the conductive pattern and the first resin layer.

6. The resin multilayer substrate according to claim 1, wherein the conductive pattern and an upper surface of the second resin layer define an uppermost surface of the resin multilayer substrate.

7. The resin multilayer substrate according to claim 1, wherein the opening is rectangular or substantially rectangular.

8. The resin multilayer substrate according to claim 1, wherein the conductive via is located at a position spaced from a center of the resin multilayer substrate as seen in plan view.

9. The resin multilayer substrate according to claim 1, wherein the conductive via is located at a center of the resin multilayer substrate as seen in plan view.

10. A resin multilayer substrate comprising:
a first resin layer including a main surface on a first side and made of a thermoplastic resin;
a plurality of conductive patterns each defined by a metal foil and located on the main surface of the first resin layer so as to be joined to a product located on the first side of the first resin layer;
a conductive via that extends through the first resin layer so as to be connected to a corresponding one of the plurality of conductive patterns; and a second resin layer that is overlaid on the first side of the first resin layer and made of a thermoplastic resin; wherein the first resin layer and the second resin layer are thermo-compression bonded to each other;

the second resin layer includes a plurality of openings through which the plurality of conductive patterns are partially exposed;

as seen in plan view, the plurality of conductive patterns include:
- a first conductive pattern located in a center portion of the product and having a length that starts from an inner peripheral edge of the opening to outside and extends under the second resin layer; and
- a second conductive pattern located at an end of the product and having a length that starts from the inner peripheral edge of the opening to outside and extends under the second resin layer; and
- a maximum value of the length of the second conductive pattern is greater than a maximum value of the length of the first conductive pattern.

11. A component module comprising:
the resin multilayer substrate according to claim 10; and
a product joined to the plurality of conductive patterns.

12. A resin multilayer substrate comprising:
a first resin layer including a main surface on a first side and made of a thermoplastic resin;
a plurality of conductive patterns each defined by a metal foil and located on the main surface of the first resin layer so as to be joined to a product located on the first side of the first resin layer;
a conductive via that extends through the first resin layer so as to be connected to a corresponding one of the plurality of conductive patterns; and
a second resin layer that is overlaid on the first side of the first resin layer and made of a thermoplastic resin; wherein
the first resin layer and the second resin layer are thermo-compression bonded to each other;
the second resin layer includes a plurality of openings through which the plurality of conductive patterns are partially exposed;
as seen in plan view, each of the plurality of conductive patterns includes:
- a length that starts from an inner peripheral edge of a corresponding one of the plurality of openings in a direction farther away from a closest end of the first resin layer and extends under the second resin layer; and
- a length that starts from the inner peripheral edge of a corresponding one of the plurality of openings in a direction closer to the closest end of the first resin layer and extends under the second resin layer;
- a maximum value of the length of the conductive pattern extending in the direction closer to the closest end of the first resin layer is greater than a maximum value of the length of the conductive pattern extending in the direction farther away from the closest end of the first resin layer.

13. The resin multilayer substrate according to claim 12, further comprising a bending portion located adjacent to the opening as seen in plan view; wherein
as seen in plan view, the inner peripheral edge of the opening includes a non-bending portion-side portion located on a side where the bending portion is not located, and a bending portion-side portion located on a side where the bending portion is located; and
the length of the conductive pattern at the bending portion-side part is greater than the length of the conductive pattern at the non-bending portion-side part.

14. The resin multilayer substrate according to claim 13, wherein at the bending portion-side portion, a third resin layer is overlaid on the first side of the second resin layer so as to at least partially cover a region in which the conductive pattern extends under the second resin layer.

15. The resin multilayer substrate according to claim 12, wherein the conductive pattern and the conductive via are electrically and mechanically joined to each other.

16. The resin multilayer substrate according to claim 12, wherein an adhesion strength between the conductive pattern and the conductive via is greater than an adhesion strength between the conductive pattern and the first resin layer.

17. The resin multilayer substrate according to claim 12, wherein the conductive pattern and an upper surface of the second resin layer define an uppermost surface of the resin multilayer substrate.

18. The resin multilayer substrate according to claim 12, wherein the opening is rectangular or substantially rectangular.

19. The resin multilayer substrate according to claim 12, wherein the conductive via is located at a position spaced from a center of the resin multilayer substrate as seen in plan view.

20. The resin multilayer substrate according to claim 12, wherein the conductive via is located at a center of the resin multilayer substrate as seen in plan view.

* * * * *